United States Patent
Cheon et al.

(10) Patent No.: US 10,951,195 B2
(45) Date of Patent: Mar. 16, 2021

(54) ACOUSTIC RESONATOR FILTER PACKAGE

(71) Applicant: Samsung Electro-Mechanics Co., Ltd., Suwon-si (KR)

(72) Inventors: Seong Jong Cheon, Suwon-si (KR); Jeong Hae Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 22 days.

(21) Appl. No.: 16/520,385

(22) Filed: Jul. 24, 2019

(65) Prior Publication Data
US 2020/0321940 A1 Oct. 8, 2020

(30) Foreign Application Priority Data
Apr. 8, 2019 (KR) .......................... 10-2019-0040723

(51) Int. Cl.
*H03H 9/56* (2006.01)
*H03H 9/52* (2006.01)
*H03H 9/13* (2006.01)
*H03H 9/17* (2006.01)

(52) U.S. Cl.
CPC ............... *H03H 9/566* (2013.01); *H03H 9/13* (2013.01); *H03H 9/174* (2013.01); *H03H 9/52* (2013.01); *H03H 9/564* (2013.01)

(58) Field of Classification Search
CPC .... H03H 9/105; H03H 9/0547; H03H 9/1092; H03H 9/0523; H03H 9/059; H03H 9/52; H03H 9/564; H03H 9/566; H03H 9/205
See application file for complete search history.

(56) References Cited

U.S. PATENT DOCUMENTS

| | | | | |
|---|---|---|---|---|
| 5,448,014 A | * | 9/1995 | Kong | ..................... H03H 9/059 174/539 |
| 6,713,314 B2 | * | 3/2004 | Wong | ..................... H01L 21/50 257/E21.499 |
| 7,339,446 B2 | * | 3/2008 | Su | ............................. B81B 7/02 333/132 |

(Continued)

FOREIGN PATENT DOCUMENTS

KR 10-1613412 B1 4/2016
KR 10-2018-0003868 A 1/2018

*Primary Examiner* — Dean O Takaoka
*Assistant Examiner* — Alan Wong
(74) *Attorney, Agent, or Firm* — NSIP Law

(57) ABSTRACT

An acoustic resonator filter package includes an acoustic resonator including a piezoelectric layer, a first electrode disposed on a first surface of the piezoelectric layer, and a second electrode disposed on a second surface of the piezoelectric layer; a first substrate having an upper surface on which the acoustic resonator is disposed, the first substrate comprising a first coupling member surrounding the acoustic resonator; a filter spaced apart from the acoustic resonator in an upward direction; a second substrate having a lower surface on which the filter is disposed, the second substrate including a second coupling member disposed above the first coupling member; and a connection member connecting the first coupling member and the second coupling member to each other, the connection member being made of a material different from a material of which the first coupling member and the second coupling member are made.

14 Claims, 12 Drawing Sheets

(56) References Cited

U.S. PATENT DOCUMENTS

| | | | | |
|---|---|---|---|---|
| 7,378,922 B2* | 5/2008 | Kubo | .................. | B81C 1/00238 |
| | | | | 333/133 |
| 7,675,154 B2* | 3/2010 | Hong | ................... | H03H 9/0547 |
| | | | | 257/686 |
| 7,863,699 B2* | 1/2011 | Dropmann | .............. | H03F 3/245 |
| | | | | 257/416 |
| 8,836,449 B2* | 9/2014 | Pang | .................... | H03H 9/0571 |
| | | | | 333/187 |
| 10,396,757 B2* | 8/2019 | Kakita | .............. | H01L 23/53242 |
| 2018/0006632 A1 | 1/2018 | Yi | | |

* cited by examiner

ACOUSTIC RESONATOR FILTER PACKAGE

CROSS-REFERENCE TO RELATED APPLICATIONS

This application claims the benefit under 35 USC 119(a) of Korean Patent Application No. 10-2019-0040723 filed on Apr. 8, 2019, in the Korean Intellectual Property Office, the entire disclosure of which is incorporated herein by reference for all purposes.

BACKGROUND

1. Field

This application relates to an acoustic resonator filter package.

1. Description of Related Art

Recently, with the rapid development of mobile communications devices, chemical devices, and biological devices, a demand for small, lightweight filters, oscillators, resonant elements, and acoustic resonant mass sensors used in such devices has increased.

An acoustic resonator may be used to implement small, lightweight filters, oscillators, resonant elements, and acoustic resonant mass sensors, and may be implemented as a film bulk acoustic resonator (FBAR).

A film bulk acoustic resonator may be mass produced at a very low cost and in a very small size. Furthermore, a film bulk acoustic resonator may implemented to have a high quality factor (Q), which is one of the main properties of a filter, and may be used in a microwave frequency band, such as a Personal Communications System (PCS) band and a Digital Cellular System (DCS) band.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator filter package includes an acoustic resonator including a piezoelectric layer, a first electrode disposed on a first surface of the piezoelectric layer, and a second electrode disposed on a second surface of the piezoelectric layer; a first substrate having an upper surface on which the acoustic resonator is disposed, the first substrate including a first coupling member surrounding the acoustic resonator; a filter spaced apart from the acoustic resonator in an upward direction; a second substrate having a lower surface on which the filter is disposed, the second substrate including a second coupling member disposed above the first coupling member; and a connection member connecting the first coupling member and the second coupling member to each other, the connection member being made of a material different from a material of which the first coupling member and the second coupling member are made.

The filter may include a high-pass filter having a cut-off frequency higher than a resonance frequency of the acoustic resonator.

The acoustic resonator filter package may further include a conductive pillar electrically connecting the filter to the first substrate.

The conductive pillar may include a first conductive coupling pillar electrically connected to the first substrate; a second conductive coupling pillar electrically connected to the filter; and a conductive connection pillar electrically connecting the first conductive coupling pillar and the second conductive coupling pillar to each other, the conductive connection pillar being made of a material different from a material of which the first conductive coupling pillar and the second conductive coupling pillar are made.

The first conductive coupling pillar, the second conductive coupling pillar, the first coupling member, and the second coupling member may be made of a first material, and the conductive connection pillar and the connection member are made of a second material different from the first material.

One end of the first conductive coupling pillar and one end of the first coupling member may be disposed on a first virtual surface parallel to the upper surface of the first substrate, and one end of the second conductive coupling pillar and one end of the second coupling member are disposed on a second virtual surface parallel to the upper surface of the first substrate and spaced apart from the first virtual surface.

The second substrate may include a cavity opening in a downward direction and having the filter disposed therein, and the acoustic resonator filter package may further include a cavity terminal disposed in the cavity and electrically connecting the filter to the second conductive coupling pillar.

The second substrate may include a cavity opening in a downward direction and having the filter disposed therein, and the acoustic resonator may further include a cavity terminal disposed in the cavity and electrically connecting the filter to the conductive pillar.

The cavity may further include an encapsulant encapsulating the filter, and the encapsulant may be spaced apart from the acoustic resonator.

The cavity terminal may be made of a material different from a material of which the conductive pillar is made.

A melting point of each of the first coupling member and the second coupling member may be lower than a melting point of the connection member.

The first substrate may include a first exposed terminal electrically connected to the first electrode of the acoustic resonator; and a second exposed terminal electrically connected to the second electrode of the acoustic resonator, wherein the first exposed terminal, the second exposed terminal, and the connection member are made of the same material.

In another general aspect, an acoustic resonator filter package includes an acoustic resonator including a piezoelectric layer, a first electrode disposed on a first surface of the piezoelectric layer, and a second electrode disposed on a second surface, of the piezoelectric layer; a first substrate having an upper surface on which the acoustic resonator is disposed; a filter spaced apart from the acoustic resonator in an upward direction; a second substrate having a lower surface on which the filter is disposed; and a connection member surrounding an accommodation space between the first substrate and the second substrate, and connecting the first substrate and the second substrate to each other, wherein the second substrate includes a cavity in which the filter is disposed, and an area of a cross-section of the cavity taken along a first plane parallel to the upper surface of the first substrate is smaller than an area of a cross-section of the accommodation space surrounded by the connection member taken along a second plane parallel to the upper surface of the first substrate.

The acoustic resonator filter package may further include a conductive pillar disposed on the upper surface of the first substrate; and a cavity terminal disposed in the cavity and electrically connecting the filter to the conductive pillar.

The conductive pillar may include a first conductive coupling pillar disposed on the upper surface of the first substrate; a second conductive coupling pillar electrically connected to the cavity terminal and disposed above the first conductive coupling pillar; and a conductive connection pillar disposed between the first conductive coupling pillar and the second conductive coupling pillar, the conductive connection pillar being made of a material different from a material of which the first conductive coupling pillar and the second conductive coupling pillar are made.

The filter may include a high-pass filter having a cut-off frequency higher than a resonance frequency of the acoustic resonator.

In another general aspect, an acoustic resonator filter package includes a first substrate having a first surface; a second substrate having a first surface, the first surface of the second substrate facing the first surface of the first substrate; an acoustic resonator disposed on the first surface of the first substrate, the acoustic resonator including a piezoelectric layer; a filter disposed on the first surface of the second substrate; and a coupling structure coupling the first substrate and the second substrate to each other so that the filter is spaced apart from the acoustic resonator, wherein the coupling structure includes a first coupling member connected to the first substrate; a second coupling member connected to the second substrate; and a connection member connecting the first coupling member and the second coupling member to each other, and the first coupling member and the second coupling member are made of a material having a lower melting point than a material of which the first substrate is made, a material of which the second substrate is made, and a material of which the connection member is made.

The acoustic resonator filter package may further include a conductive pillar electrically connecting the filter to the first substrate.

The second substrate may include a cavity opening toward the first surface of the first substrate and having the filter disposed therein, and the acoustic resonator filter package may further include a cavity terminal disposed in the cavity and electrically connecting the filter to the conductive pillar.

The conductive pillar may include a first conductive coupling pillar electrically connected to the first substrate; a second conductive coupling pillar electrically connected to the filter; and a conductive connection pillar electrically connecting the first conductive coupling pillar to the second conductive coupling pillar, the first conductive coupling pillar and the second conductive coupling pillar may be made of the same material as the first coupling member and the second coupling member, and the conductive connection pillar may be made of the same material as the connection member.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
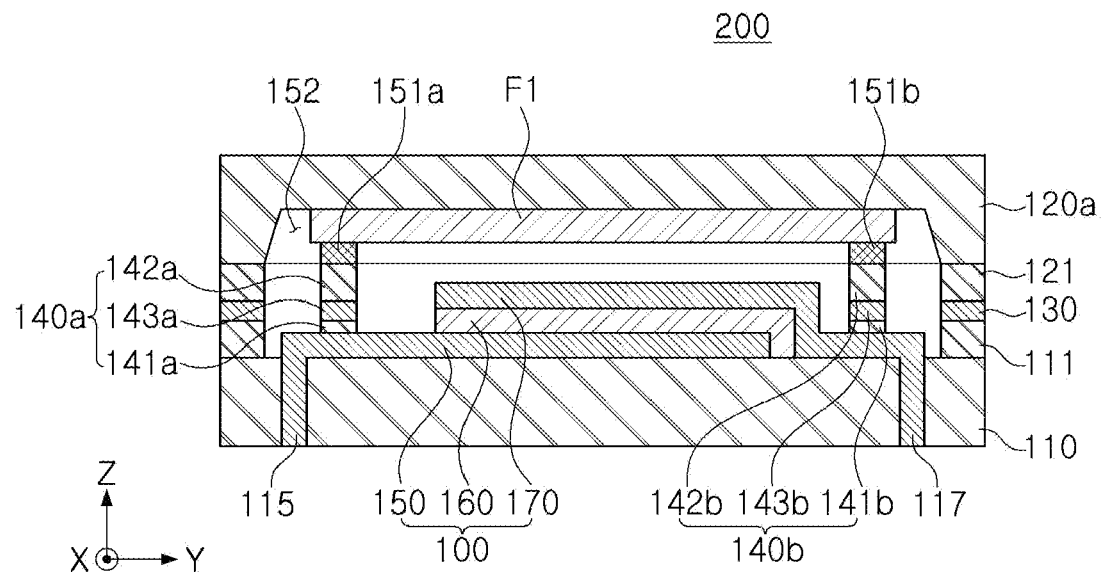
FIG. 1A is a cross-sectional diagram illustrating an example of an acoustic resonator filter package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

FIG. 1A is a cross-sectional diagram illustrating an example of an acoustic resonator filter package.

Referring to FIG. 1A, an acoustic resonator filter package 200 includes an acoustic resonator 100, a first substrate 110, a filter F1, a second substrate 120a, and a connection member 130.

The acoustic resonator 100 includes a piezoelectric layer 160, a first electrode 150, and a second electrode 170.

The piezoelectric layer 160 includes a piezoelectric material exhibiting a piezoelectric effect that converts electrical energy into mechanical energy in the form of elastic waves. For example, the piezoelectric material may include any one of aluminum nitride (AlN), zinc oxide (ZnO), and lead zirconate titanate (PZT; PbZrTiO), may further include either one or both of a rare earth metal and a transition metal, and may also include magnesium (Mg), which is a divalent metal. For example, the rare earth metal may include any one or any combination of any two or more of scandium (Sc), erbium (Er), yttrium (Y), and lanthanum (La), and the transition metal may include any one or any combination of any two or more of titanium (Ti), zirconium (Zr), hafnium (Hf), tantalum (Ta), and niobium (Nb).

The first electrode 150 is disposed on a first surface (i.e., a lower surface) of the piezoelectric layer 160, and the second electrode 170 is disposed on a second surface (i.e., an upper surface) of the piezoelectric layer 160. Accordingly, the first electrode 150 and the second electrode 170 may provide electrical energy to the piezoelectric layer 160 and receive electrical energy from the piezoelectric layer 160. For example, the first electrode 150 and the second electrode 170 each may have any one or any combination of any two or more of a thickness, a width, a length, and a resistivity corresponding to a wavelength of a radio-frequency (RF) signal to enable an electrical signal such as an RF signal to be efficiently input to the piezoelectric layer 160 and output from the piezoelectric layer 160.

For example, the first electrode 150 and the second electrode 170 may be made of a conductive material such as molybdenum (Mo) or an alloy thereof to improve a coupling efficiency with the piezoelectric layer 160, but are not limited thereto. The first electrode 150 and the second electrode 170 may be made of a conductive material including any one or any combination of any two or more of ruthenium (Ru), tungsten (W), iridium (Ir), platinum (Pt), copper (Cu), titanium (Ti), tantalum (Ta), nickel (Ni), chromium (Cr), any alloy thereof.

An active region of the acoustic resonator 100 is a region of the acoustic resonator 100 in which the first electrode 150, the piezoelectric layer 160, and the second electrode 170 overlap one another in a direction perpendicular to the upper and lower surfaces of the piezoelectric layer 160 (i.e., a Z direction in FIG. 1A). The active region of the piezoelectric layer 160 resonates at a resonance frequency in response to electrical energy of a certain frequency in the electrical energy flowing between the first electrode 150 and the second electrode 170. Accordingly, the active region of the piezoelectric layer 160 significantly impedes the passage of electrical energy at the resonance frequency.

Thus, the acoustic resonator 100 allows electrical energy around the resonance frequency to pass through the acoustic resonator 100, while significantly impeding the passage of electrical energy at the resonance frequency. Thus, the acoustic resonator 100 has a stop band having sharp skirt properties, and may be used as an RF filter having sharp skirt properties.

The acoustic resonator 100 may be included in a combination structure of a plurality of acoustic resonators 100. The combination structure may have a passband for an RF signal based on a combination of a first resonance frequency of the acoustic resonator 100 among the plurality of acoustic resonators 100, and a second resonance frequency of another acoustic resonator 100 among the plurality of acoustic resonators 100. The passband has sharp skirt properties depending on skirt properties of the two acoustic resonators 100 having the first and second resonance frequencies.

The sharper the skirt properties, the more difficult it is to broaden a bandwidth of a passband. The bandwidth may be broadened by increasing the number of acoustic resonators 100 in the combination structure. For example, by disposing first, second, third, and fourth acoustic resonators 100 having first, second, third, and fourth resonance frequencies side by side in the combination structure, the passband of the combination structure may be broadened.

Thus, by providing the structure illustrated in FIG. 1 in which the acoustic resonator 100 is combined with the filter F1, the passband of the acoustic resonator filter package 200 may be broadened.

Thus, the filter F1 may be used to expand a passband of the acoustic resonator 100. The filter F1 may include an acoustic resonator with a piezoelectric layer like the acoustic resonator 100, or may include a capacitor and an inductor, or may include a conductive element and a dielectric element.

The smaller the overall size of the acoustic resonator 100, the higher the resonance frequency of the acoustic resonator 100. Thus, the smaller the size of the acoustic resonator 100, the higher the frequency band in which the acoustic resonator 100 may be used.

However, when a size of the acoustic resonator 100 is reduced beyond a certain point, a resistance value of each of the first electrode 150 and the second electrode 170 will increase due to a decrease in a thickness of each of the first electrode 150 and the second electrode 170, and a conversion efficiency between electrical energy and mechanical energy in the piezoelectric layer 160 will decrease due to a decrease in an area of each of the first electrode 150 and the second electrode 170 taken in a horizontal direction i.e., an X direction and/or a Y direction in FIG. 1A), which will increase an insertion loss of the acoustic resonator 100.

The filter F1 may filter an RF signal of a high frequency band that may be relatively difficult for the acoustic resonator 100 to filter. Accordingly, since the acoustic resonator filter package 200 provides a structure in which the acoustic resonator 100 and the filter F1 are combined, the acoustic resonator filter package 200 may provide an effective filtering performance for both a relatively low frequency band (e.g., 3 to 4 GHz) and a relatively high frequency band (e.g., 5 to 6 GHz).

For example, the filter F1 may be a high-pass filter having a cut-off frequency higher than a resonance frequency of the acoustic resonator 100. The cut-off frequency may correspond to a resonance frequency.

Since the high-pass filter may be implemented by combination of resonance frequencies lower than a portion of resonance frequencies of a band-pass filter, the high-pass filter may more easily provide good filtering performance than a band-pass filter with respect to a relatively high frequency band. Thus, the acoustic resonator filter package 200 is able to efficiently implement good filtering performance with respect to a relatively high frequency band.

The filter F1 is spaced apart from the acoustic resonator 100 in an upward direction. Accordingly, by disposing the filter F1 and the acoustic resonator 100 between the first substrate 110 and the second substrate 1201 and spacing the filter F1 apart from the acoustic resonator 100, interference between the filter F1 and the acoustic resonator 100 may be reduced, and a size of the acoustic resonator filter package 200 may be efficiently reduced.

The first substrate 110 has an upper surface on which the acoustic resonator 100 is disposed. The first substrate 110 includes a first coupling member 111 surrounding the acoustic resonator 100 in a horizontal direction.

The second substrate 120a has a lower surface on which the filter F1 is disposed. The second substrate 120a includes a second coupling member 121 disposed above the first coupling member 111.

The acoustic resonator 100 and the filter F1 are disposed between the first substrate 110 and the second substrate 120a. Accordingly, a size of the acoustic resonator filter package 200 may easily be reduced.

For example, a lower portion of the first substrate 110 and/or an upper portion of the second substrate 120a may be removed by an etching process. The acoustic resonator 100 and the filter F1 are protected from an external environment by the first substrate 110 and/or the second substrate 120a during a process of reducing a size of the first substrate 110 and/or the second substrate 120a. Thus, the acoustic resonator filter package 200 may have a reduced size in accordance with the reduction in size of the first substrate 110 and/or the second substrate 120a without any substantial deterioration of the acoustic resonator 100 and the filter F1.

For example, the first substrate 110 and the second substrate 120a may be a silicon wafer, or a silicon-on-insulator type substrate, or a substrate used in wafer-level packaging.

An accommodation space between the first substrate 110 and the second substrate 120a is stably provided to accommodate the acoustic resonator 100 disposed on the first substrate 110 and the filter F1 disposed on the second substrate 120a and provide a spacing between the acoustic resonator 100 and the filter F1.

To this end, the acoustic resonator filter package 200 includes the connection member 130 connecting the first substrate 110 to the second substrate 120a and surrounding the accommodation space.

The connection member 130 connects the first coupling member 111 to the second coupling member 121, and is made of a material different from a material of which the first coupling member 111 and the second coupling member 121 are made.

For example, the first coupling member 111 and the second coupling member 121 may be made of a material having a relatively low melting point, such as tin (Sn), and the connection member 130 may be made of a relatively stable metal having a relatively high melting point, such as gold (Au). Furthermore, the melting point of the first coupling member 111 and the second coupling member 121 is lower than a melting point of the first substrate 110 and the second substrate 120a.

The connection member 130 is disposed between the first coupling member 111 and the second coupling member 121, and is compressed in a direction perpendicular to (i.e., the Z direction in FIG. 1) at a temperature higher than a melting point of the first coupling member 111 and the second coupling member 121 so that an accommodation space between the acoustic resonator 100 and the filter F1 is stably provided. Thus, the first coupling member 111, the connection member 130, and the second coupling member 121 constitute a coupling structure coupling the first substrate 110 and the second substrate 120a to each other. Furthermore, the connection member 130 serves as a structure stably providing a spacing distance between the first substrate 110 and the second substrate 120a so that a certain spacing distance or more is stably provided between the first substrate 110 and the second substrate 120a.

Thus, by stably providing an accommodation space between the acoustic resonator 100 and the filter F1, the acoustic resonator filter package 200 prevents a deterioration in performance of each of the acoustic resonator 100 and the filter F1, and has a reduced size.

Also, the second substrate 120a includes a cavity 152 facing in a downward direction. The filter F1 is disposed in the cavity 152.

Accordingly, a certain spacing distance or more is stably provided between the first substrate 110 and the second substrate 120a.

Also, as the spacing distance between the first substrate 110 and the second substrate 120a decreases, a height of the coupling structure coupling the first substrate 110 and the second substrate 120a to each other may be decreased, and the coupling structure may have a simplified structure. For example, the first coupling member 111 and/or the second coupling member 121 of the coupling structure may be omitted.

The acoustic resonator filter package 200 further includes conductive pillars 140a and 140b to efficiently provide electrical connection paths between the filter F1 and the second substrate 120a Although the example in FIG. 1A shows two conductive pillars 140a and 140b, in other examples there may be only one conductive pillar, or three or more conductive pillars.

The conductive pillars 140a and 140b reduce an electrical path length between the filter F1 and the first substrate 110, thereby reducing a transmission loss of an RF signal flowing between the filter F1 and the first substrate 110.

The conductive pillar 140a includes a first conductive coupling pillar 141a electrically connected to the first substrate 110, a second conductive coupling pillar 142a electrically connected to the filter F1, and a conductive connection pillar 143a connecting the first conductive coupling pillar 141a and the second conductive coupling pillar 142a to each other. The conductive connection pillar 143a is made of a material different from a material of which the first conductive coupling pillar 141a and the second conductive coupling pillar 142a are made.

Likewise, the conductive pillar 140b includes a first conductive coupling pillar 141b electrically connected to the first substrate 110, a second conductive coupling pillar 142b electrically connected to the filter F1, and a conductive connection pillar 143b connecting the first conductive coupling pillar 141b and the second conductive coupling pillar 142b to each other. The conductive connection pillar 143b is made of a material different from a material of which the first conductive coupling pillar 141b and the second conductive coupling pillar 142b are made.

Accordingly, the conductive pillars 140a and 140b may be stably formed. For example, the conductive pillars 140a and 140b may be formed together with the connection member 130.

Thus, the first conductive coupling pillars 141a and 141b, the second conductive coupling pillars 142a and 142b, the first coupling member 111, and the second coupling member 121 may be made of the same material (e.g., tin), and the conductive connection pillars 143a and 143b and the connection member 130 may be made of the same material (e.g., gold). Accordingly, a manufacturing efficiency of the acoustic resonator filter package 200 may be improved.

Upper ends of the conductive pillars 140a and 140b are electrically connected to cavity terminals 151a and 151b disposed in the cavity 152. The cavity terminals 151a and 151b provide a surface for supporting the second conductive coupling pillars 142a and 142b during a manufacturing process. Accordingly, the conductive pillars 140a and 140b may be efficiently coupled to the second substrate 120a having the cavity 152.

The cavity terminals 151a and 151b are made of a material different from a material of which the conductive pillars 140a and 140b are made, so the cavity terminals 151a and 151b may stably provide a surface for supporting the second conductive coupling pillars 142a and 142b during a manufacturing process, but the material of the cavity terminals 151a and 151b is not limited thereto.

Also, the lower ends of the cavity terminals 151a and 151b may be aligned with the lower surface of the substrate 120a, but are not limited thereto.

The first substrate 110 includes a first exposed terminal 117 electrically connected to the first electrode 150 and exposed on a lower surface of the first substrate 110, and a second exposed terminal 117 electrically connected to the second electrode 170 and exposed on the lower surface of the second substrate 110. The first and second exposed terminals 115 and 117 may be made of the same material (e.g., gold) as the connection member 130. Accordingly, a resistivity of the first and second exposed terminals 115 and 117 may easily be reduced, and a transmission loss of an RF signal passing through the acoustic resonator 100 may be reduced.

Figure 1B:
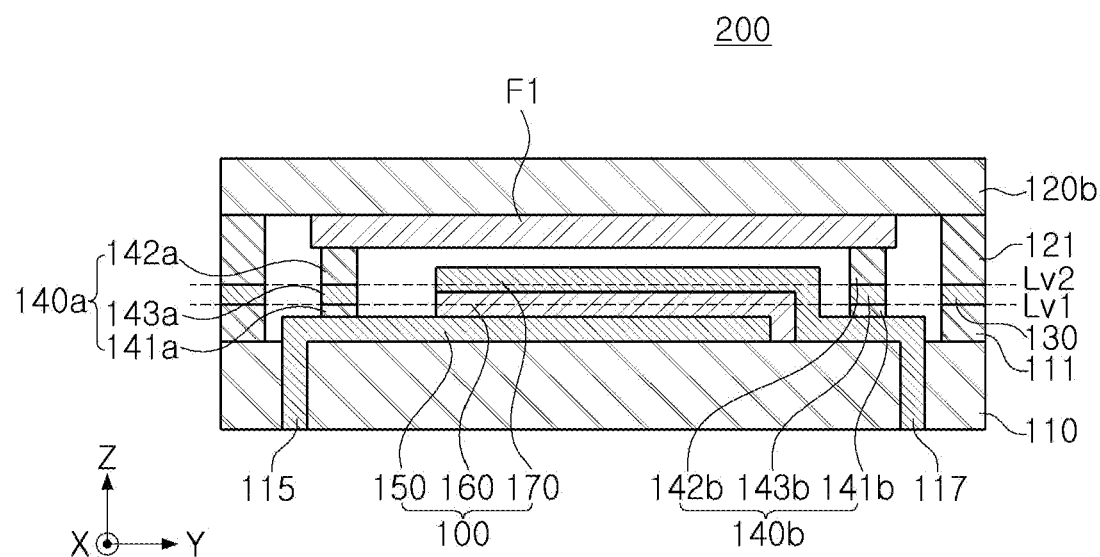
FIG. 1B is a cross-sectional diagram illustrating another example of an acoustic resonator filter package in which a cavity has been omitted.
Figure 1C:
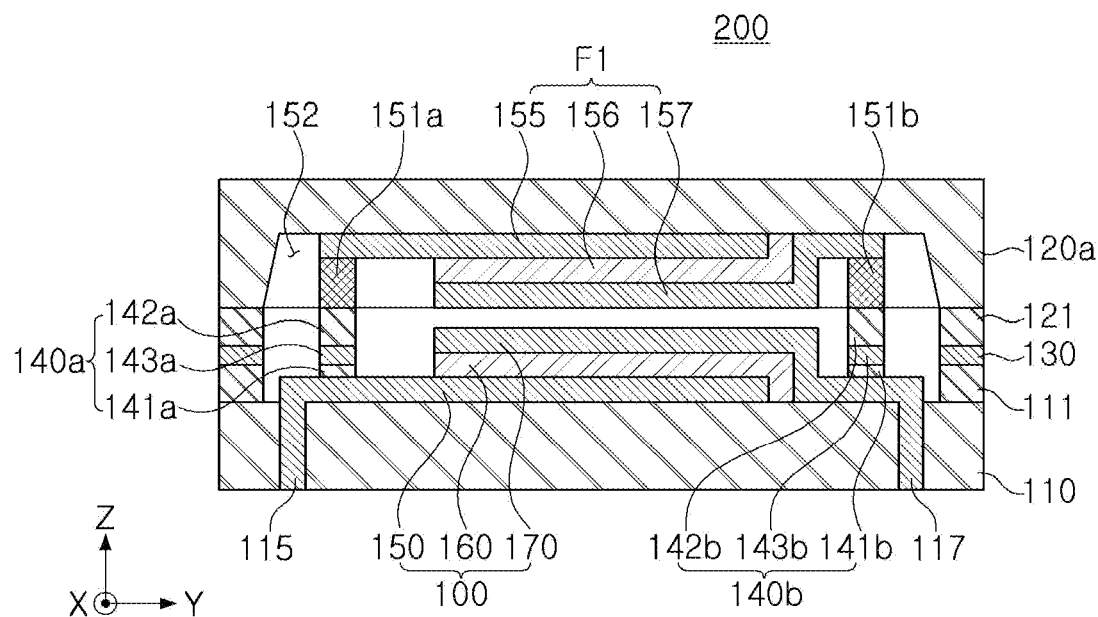
FIG. 1C is a cross-sectional diagram illustrating another example of an acoustic resonator filter package in which a filter has a structure similar to a structure of an acoustic resonator.

FIG. 1B is a cross-sectional diagram illustrating another example of an acoustic resonator filter package in which a cavity has been omitted.

Referring to FIG. 1B, a lower surface of a second substrate 120b is planar, and is spaced far enough away from an upper surface of a first substrate 110 to accommodation to provide space to accommodate the acoustic resonator 100 and the filter F1. Thus, the second substrate 120b does not include a cavity like the cavity 152 of FIG. 1.

One end of each of first conductive coupling pillars 141a and 141b and one end of a first coupling member 111 are disposed on a first virtual surface Lv1 parallel to the upper surface of the first substrate 110, and one end of each of second conductive coupling pillars 142a and 142b and one end of a second coupling member 121 are disposed on a second virtual surface Lv2 parallel to the upper surface of the first substrate 110 and spaced apart from the first virtual surface Lv1. The position of the first virtual surface Lv1 and the position of the second virtual surface Lv2 are not limited to any particular positions.

Accordingly, conductive pillars 140a and 140b and a connection member 130 may be efficiently formed during a manufacturing process.

FIG. 10 is a cross-sectional diagram illustrating another example of an acoustic resonator filter package in which a filter has a structure similar to a structure of an acoustic resonator.

Referring to FIG. 10, a filter F1 has a structure in which a first filter electrode 155, a filter piezoelectric layer 156, and a second filter electrode 157 are stacked, thereby having a structure similar to a structure of an acoustic resonator 100.

The first filter electrode 155, the filter piezoelectric layer 156, and the second filter electrode 157 of the filter F1 are disposed in a cavity 152 of a second substrate 120a like the filter F1 of FIG. 1A. Therefore, type of the filter F1 of the acoustic resonator filter package 200 may be selected from different types of filters, such as a piezoelectric type and a component type.

Figure 1D:
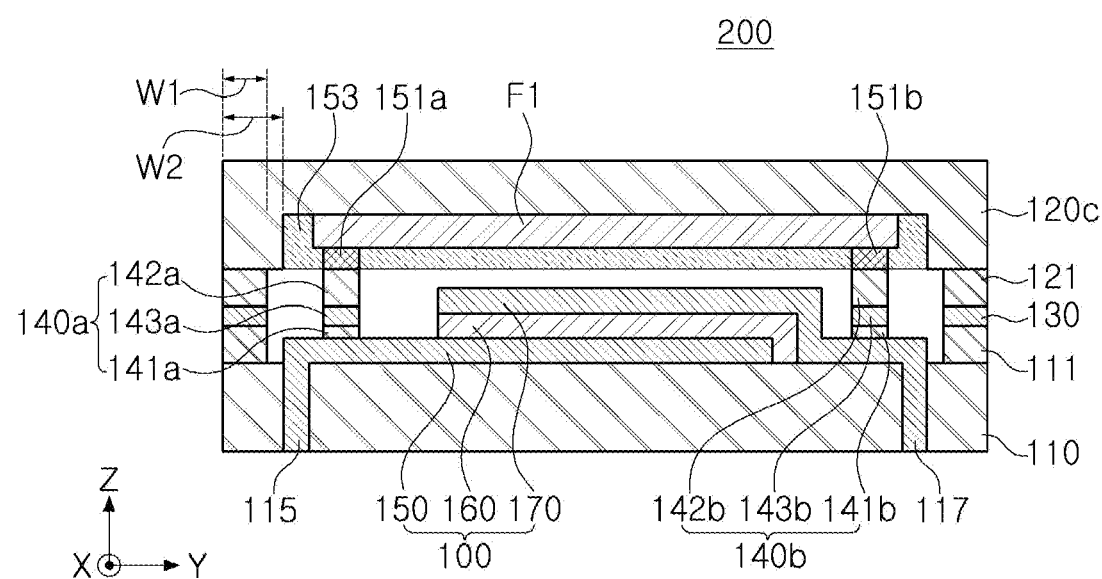
FIG. 1D is a cross-sectional diagram illustrating another example of an acoustic resonator filter package in which a cavity in which a filter is disposed is filled with an encapsulant.

FIG. 1D is a cross-sectional diagram illustrating another example of an acoustic resonator filter package in which a cavity in which a filter is disposed is filled with an encapsulant.

Referring to FIG. 1D, a cavity of a second substrate 120c includes an encapsulant 153 encapsulating a filter F1. The cavity is filled with the encapsulant 153 before the second substrate 120c is coupled to a first substrate 110. Thus, the encapsulant 153 is spaced apart from an acoustic resonator 100.

Accordingly, an accommodation space of an acoustic resonator filter package 200 to accommodate the acoustic resonator 100 and the filter F1 is stably formed in this example.

For example, the encapsulant 153 may be a photoimageable encapsulant (PIE), an Ajinomoto build-up film (ABF), or an epoxy molding compound (EMC), but is not limited thereto.

Referring to FIG. 1D, a width W2 of a portion of the second substrate 120c surrounding the cavity of the second substrate 120c is greater than a width W1 of a connection member 130 surrounding the accommodation space.

Therefore, an area of a cross-section of the cavity of the second substrate 120c in which the filter F1 is disposed taken along a first plane parallel to an upper surface of the first substrate 110 is smaller than an area of a cross-section of the accommodation space surrounded by the connection member taken along a second plane parallel to the upper surface of the first substrate 110.

Thus, a structure of the second substrate 120c including the cavity is different from a structure of a cap. Compared to a structure of a cap, the second substrate 120c including the cavity makes it easy to reduce a thickness of the acoustic resonator filter package 200 in a direction perpendicular to the upper surface of the first substrate 110 (i.e., a Z direction in FIG. 1D).

Figure 2:
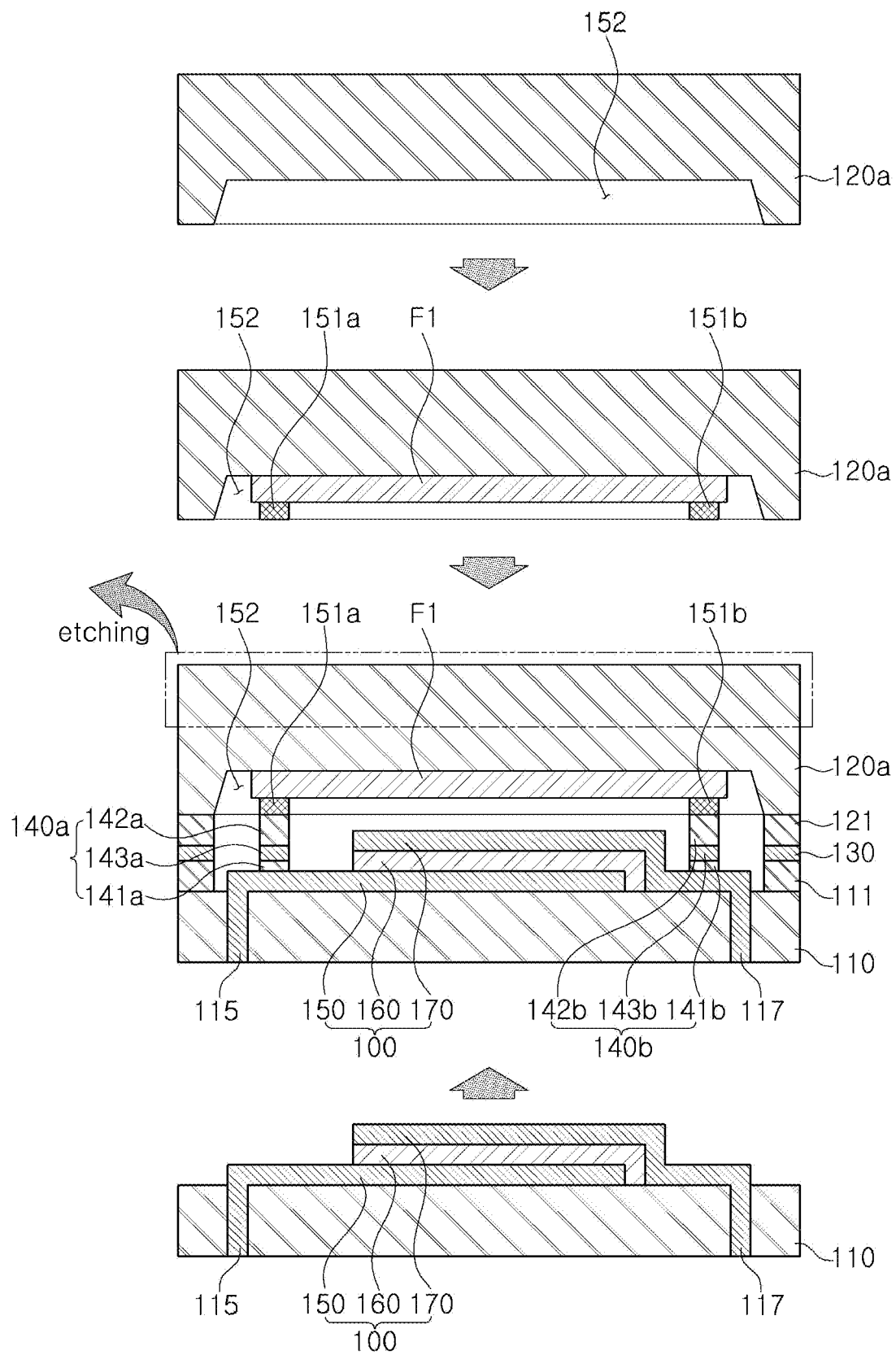
FIG. 2 is a diagram illustrating an example of a process of packaging an acoustic resonator filter package.

FIG. 2 is a diagram illustrating an example of a process of packaging an acoustic resonator filter package.

Referring to FIG. 2, a cavity 152 is formed in a second substrate 120a, and a filter F1 and cavity terminals 151a and 151b are disposed in the cavity 152. In some examples, like in the example of FIG. 1B, the cavity 152 may be omitted.

An acoustic resonator 100 is disposed on an upper surface of a first substrate 110.

The first substrate 110 and the second substrate 120a are coupled to each other through a first coupling member 111 disposed on the first substrate 110, a connection member 130, and a second coupling member 121 disposed on the second substrate 120a. In other examples, either one or both of the first coupling member 111 and the second coupling member 121 may be omitted.

Figure 3:
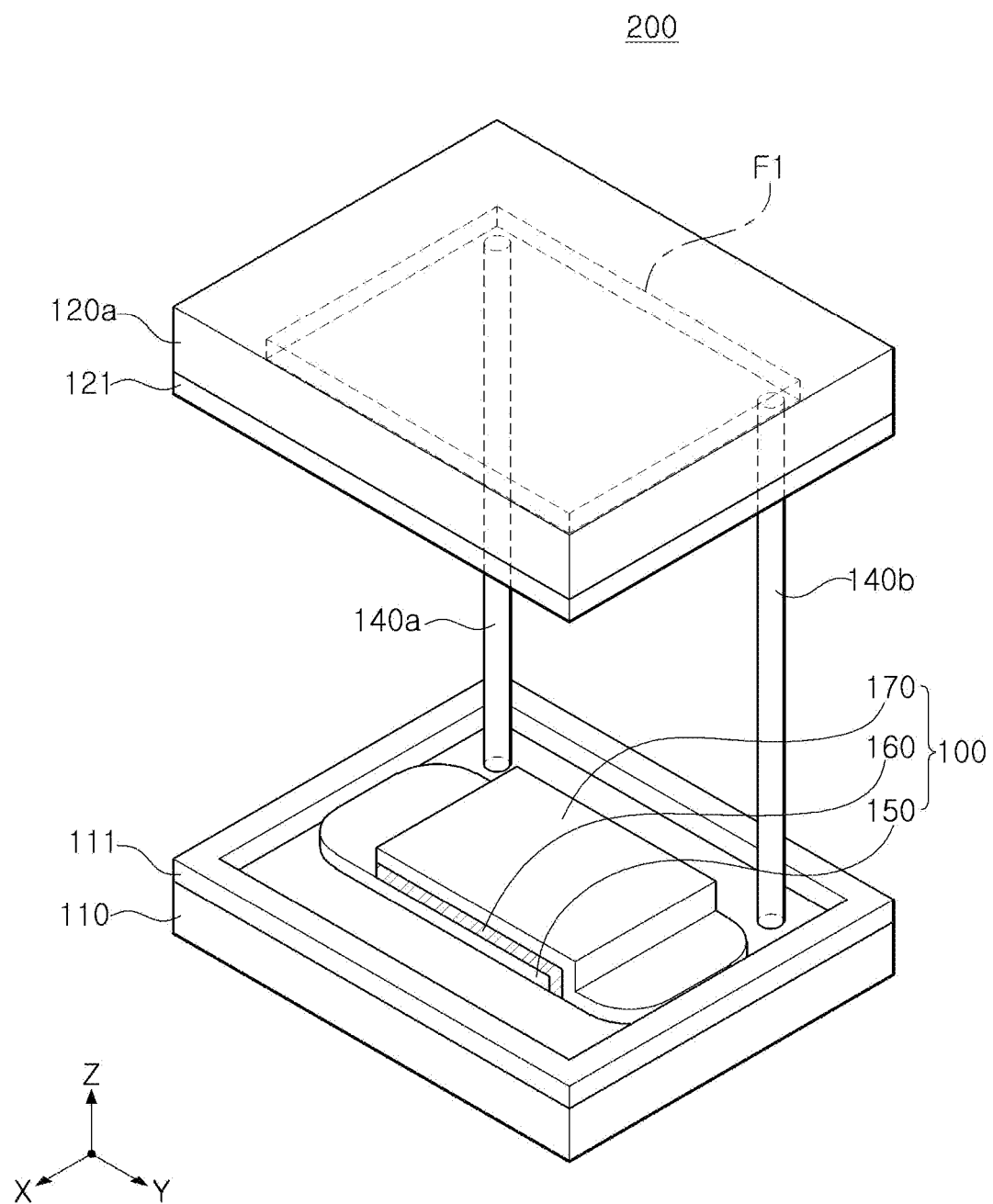
FIG. 3 is a perspective diagram illustrating an example of an acoustic resonator filter package.

FIG. 3 is a perspective diagram illustrating an example of an acoustic resonator filter package.

Referring to FIG. 3, a first coupling member 111 and a second coupling member 121 surround in a horizontal direction an accommodation space in which an acoustic resonator 100 and a filter F1 are disposed.

Figure 4A:
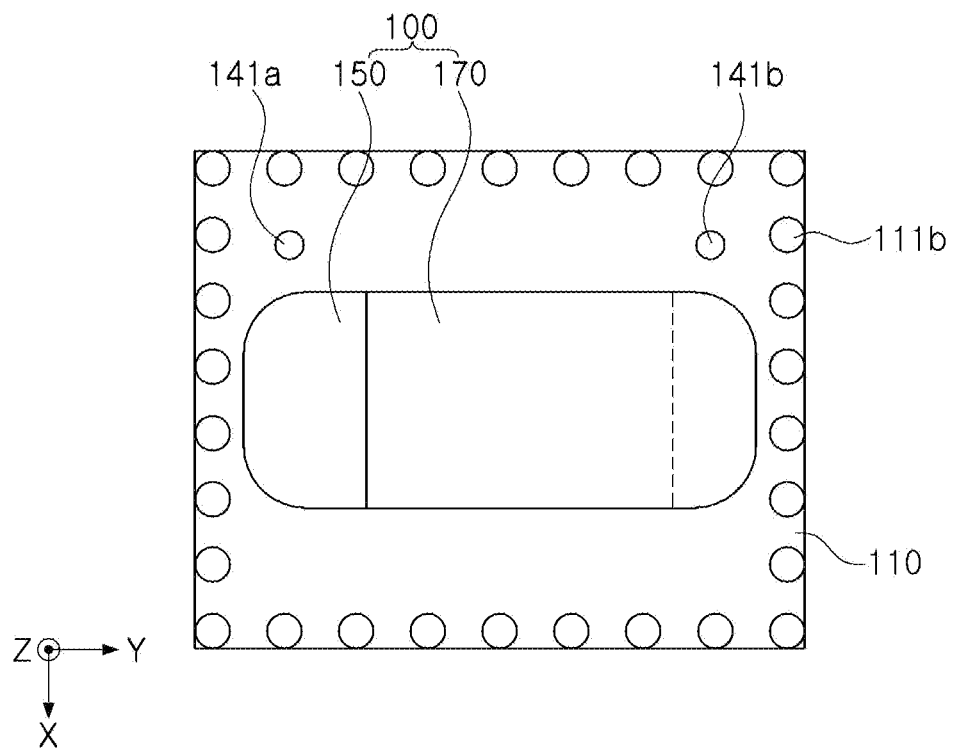
FIG. 4A is a plan diagram illustrating an example of a first substrate of an acoustic resonator filter package.
Figure 4B:
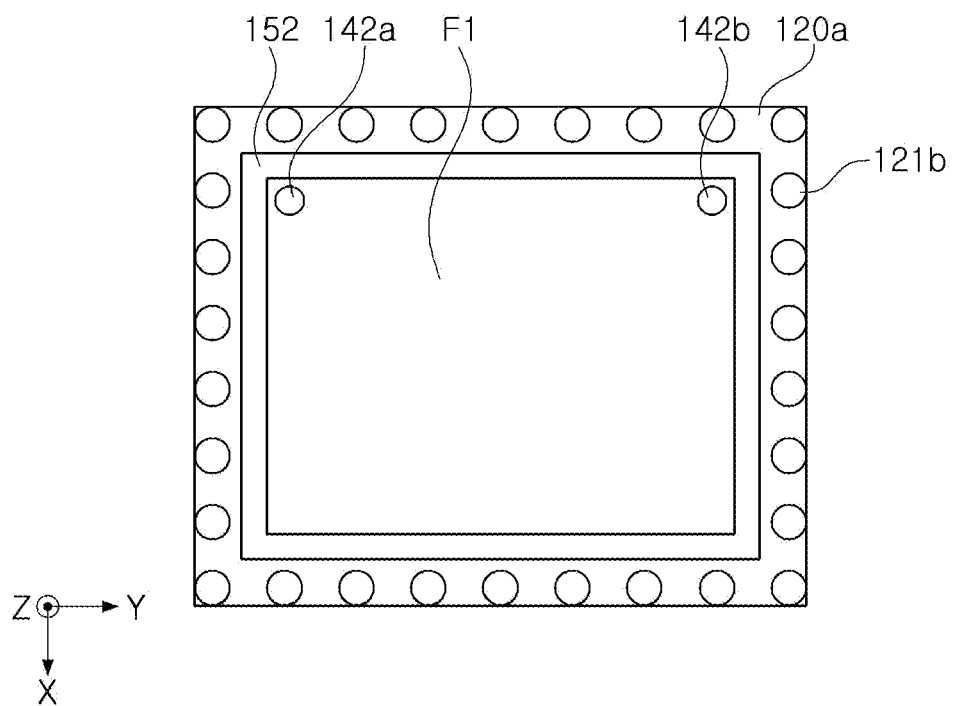
FIG. 4B is a plan diagram illustrating an example of a second substrate of an acoustic resonator filter package.

FIG. 4A is a plan diagram illustrating an example of a first substrate of an acoustic resonator filter package, and FIG. 4B is a plan diagram illustrating an example of a second substrate of an acoustic resonator filter package.

Referring to FIG. 4A, a first coupling member 111b has a structure in which a plurality of pillars are disposed along an edge of a first substrate 110.

Referring to FIG. 4B, a second coupling member 121b has a structure in which a plurality of pillars are disposed along an edge of a second substrate 120a, and are disposed above the pillars of the first coupling member 111b in a Z direction.

Also, an area of an accommodation space surrounded by the second coupling member 121b is greater than an area of a cavity 152.

Figure 5:
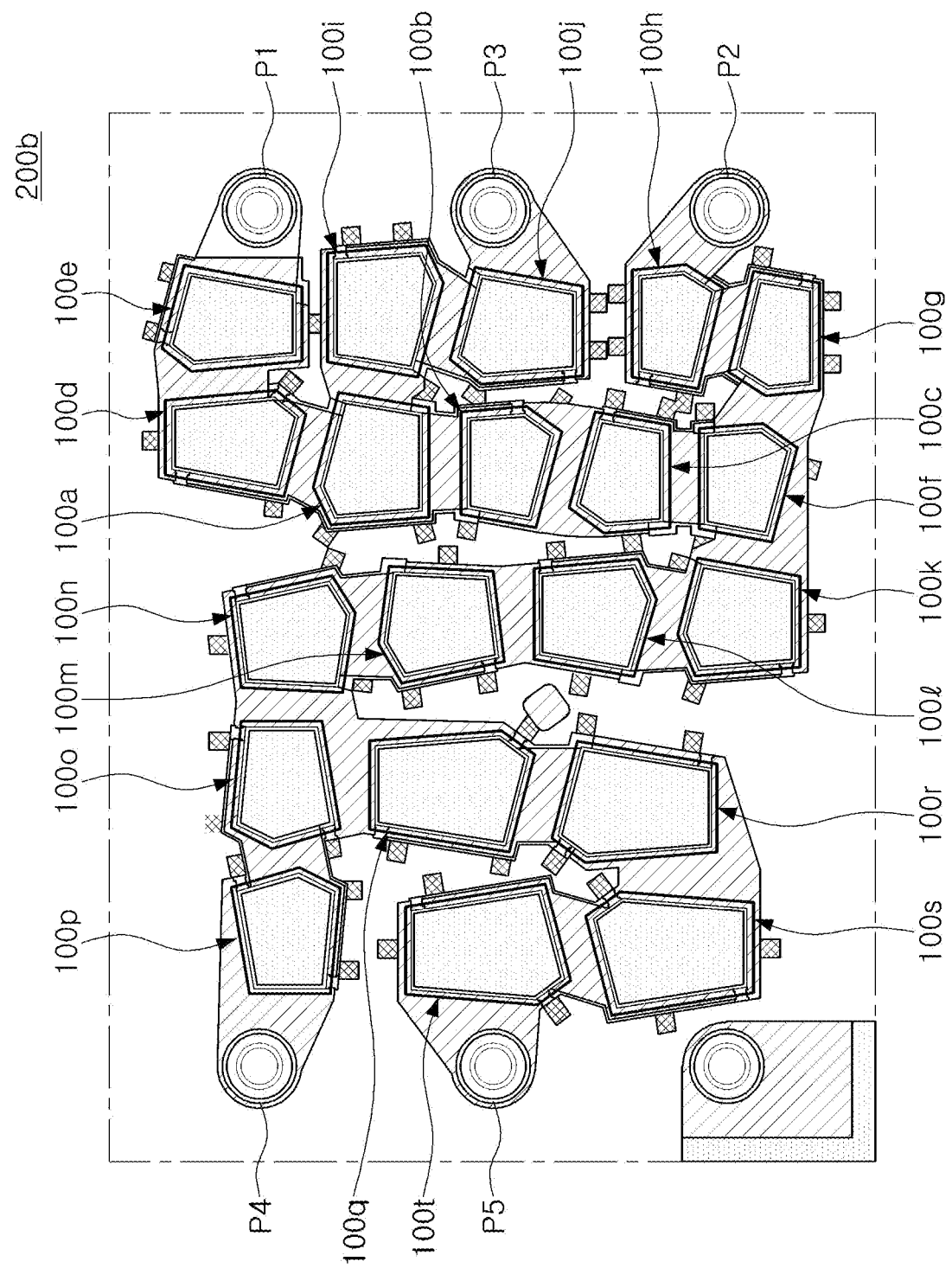
FIG. 5 is a plan diagram illustrating examples of connections between a plurality of acoustic resonators of an acoustic resonator filter package.

FIG. 5 is a plan diagram illustrating examples of connections between a plurality of acoustic resonators of an acoustic resonator filter package.

Referring to FIG. 5, an acoustic resonator filter package 200b includes a plurality of acoustic resonators 100a, 100b, 100c, 100d, 100e, 100f, 100g, 100h, 100i, 100j, 100k, 100l, 100m, 100n, 100o, 100p, 100q, 100r, 100s, and 100t electrically connected to each other and electrically connected to first, second, third, fourth, and fifth ports P1, P2, P3, P4, and P5. A structure of each of the plurality of acoustic resonators is not limited to any particular structure, but may be implemented as a structure illustrated in FIGS. 9A to 9C.

One or more of the first, second, third, fourth, and fifth ports P1, P2, P3, P4, and P5 may be connected to one or more of the first exposed terminal 115, the second exposed terminal 117, and the conductive pillars 140a and 140b of FIGS. 1A to 1D, 2, and 3.

Figure 6A:
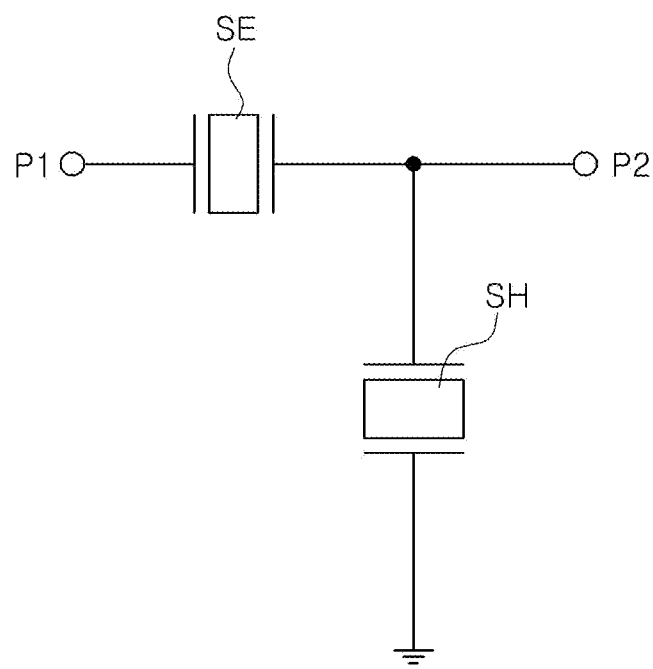
FIG. 6A is a circuit diagram illustrating an example of a band-pass filter structure formed by acoustic resonators of an acoustic resonator filter package.

FIG. 6A is a circuit diagram illustrating an example of a band-pass filter structure formed by acoustic resonators of an acoustic resonator filter package.

Referring to FIG. 6A, a series acoustic resonator SE and a shunt acoustic resonator SH of an acoustic resonator filter package are combined to form a band-pass filter structure. At least one of the series acoustic resonator SE and the shunt acoustic resonator SH may be the acoustic resonator 100 of FIGS. 1A to 1D, 2, and 3.

Figure 6B:
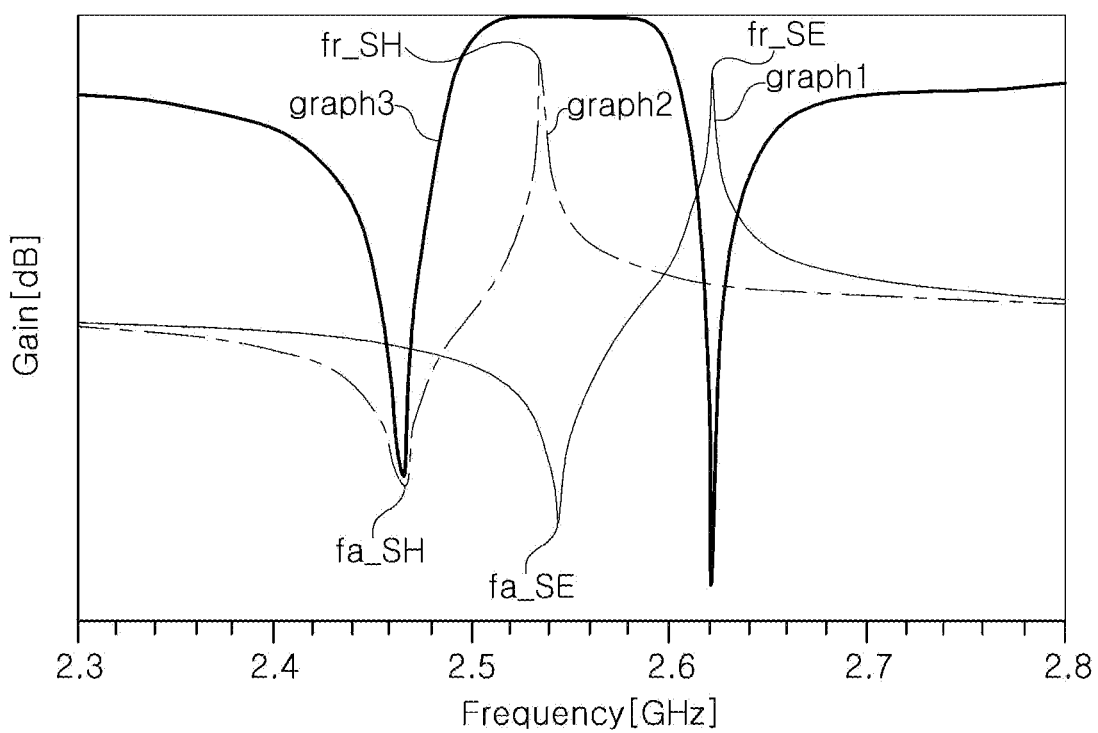
FIG. 6B is a graph illustrating an example of a passband of the band-pass filter structure of FIG. 6A.

FIG. 6B is a graph illustrating an example of a passband of the band-pass filter structure of FIG. 6A.

Referring to FIG. 6B, a gain graph3 of the band-pass filter structure of FIG. 6A including a series acoustic resonator SE and a shunt acoustic resonator SH has a bandpass property and is determined based on a gain graph1 of the series acoustic resonator SE and a gain graph2 of the shunt acoustic resonator SH.

The series acoustic resonator SE has an anti-resonance frequency fa_SE and a resonance frequency fr_SE, and the shunt acoustic resonator SH has an anti-resonance frequency fa_SH and a resonance frequency fr_SH.

FIG. 6B illustrates an example in which the passband of the band-pass filter structure of FIG. 6A is 2.5 GHz to 2.6 GHz, but a position of the passband in the spectrum is not limited to any particular position.

Figure 7A:
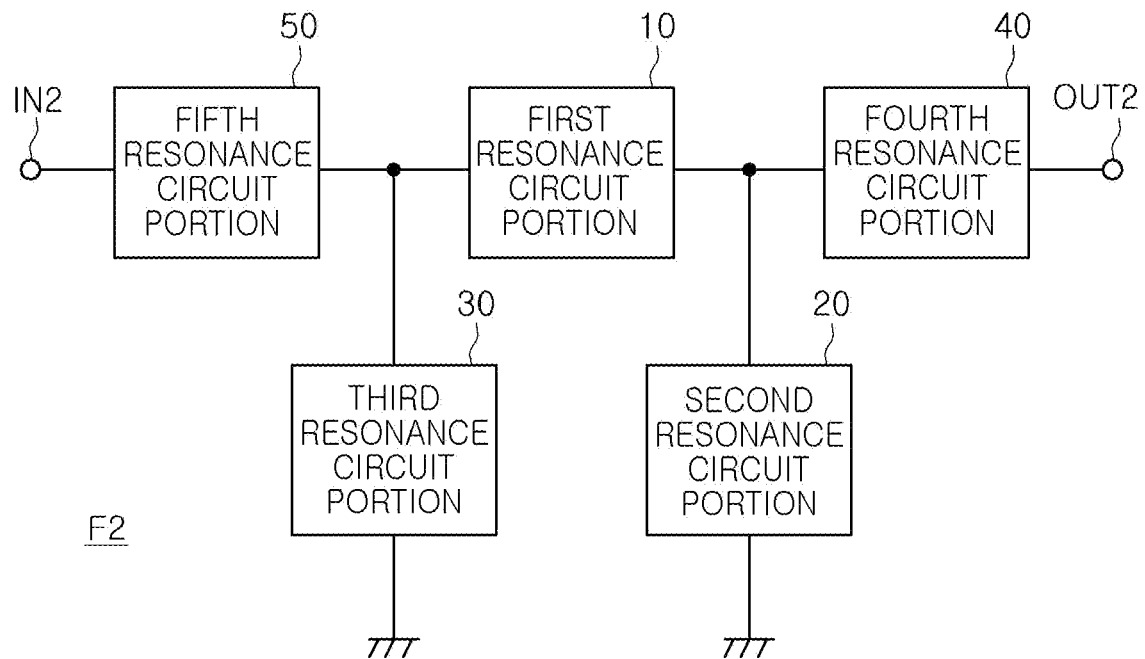
FIG. 7A is a block diagram illustrating an example of a high-pass filter of an acoustic resonator filter package.
Figure 7B:
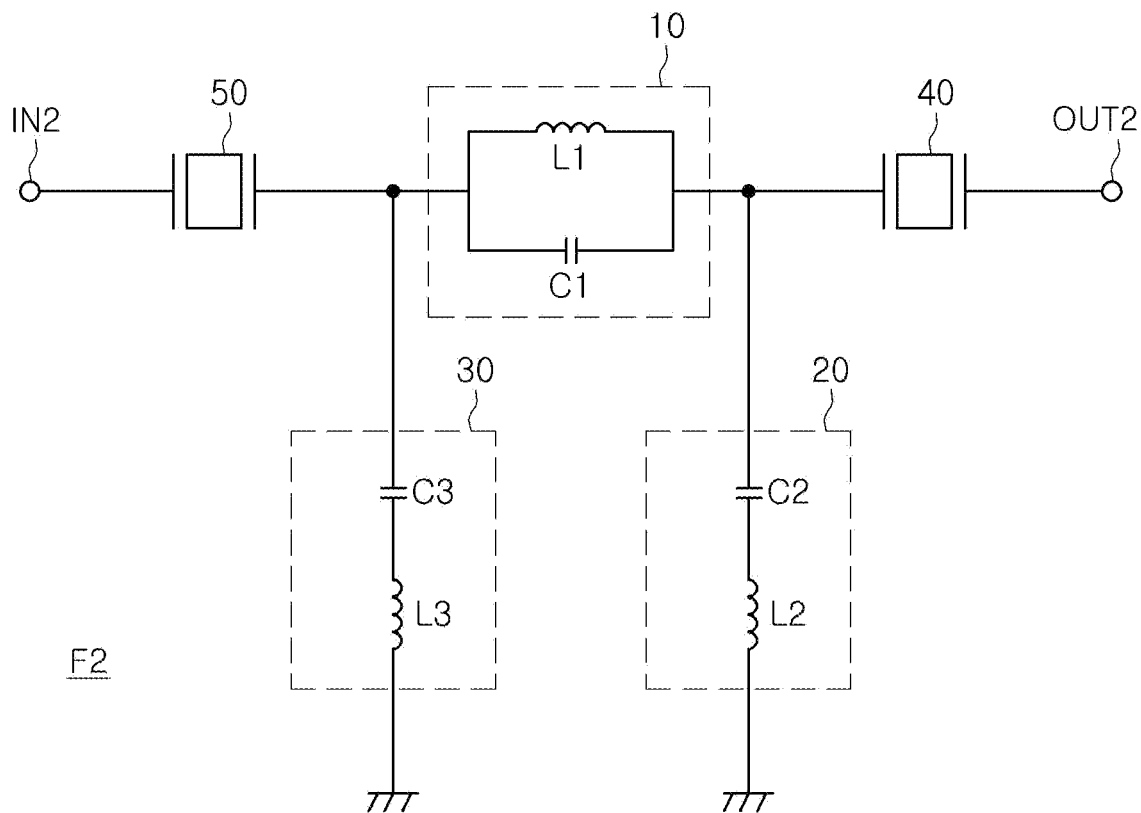
FIG. 7B is a circuit diagram illustrating an example of the high-pass filter of FIG. 7A.

FIG. 7A is a block diagram illustrating an example of a high-pass filter of an acoustic resonator filter package, and FIG. 7B is a circuit diagram illustrating an example of the high-pass filter of FIG. 7A.

Referring to FIGS. 7A and 7B, a high-pass filter F2 having a high-pass property is formed by a combination of first, second, third, fourth, and fifth resonance circuit portions 10, 20, 30, 40, and 50 of an acoustic resonator filter package, and includes an input terminal IN2 and an output terminal OUT2.

The first resonance circuit portion 10 includes a first capacitor C1 and a first inductor L1 connected in parallel, the second resonance circuit portion 20 includes a second capacitor C2 and a second inductor L2 connected in series, and the third resonance circuit portion 30 includes a third capacitor C3 and a third inductor L3 connected in series.

The fourth resonance circuit portion 40 and the fifth resonance circuit portion 50 each include an acoustic resonator.

The high-pass filter F2 is not limited to the structures illustrated in FIGS. 7A and 7B, and may be implemented as a single component filter type.

Figure 8:
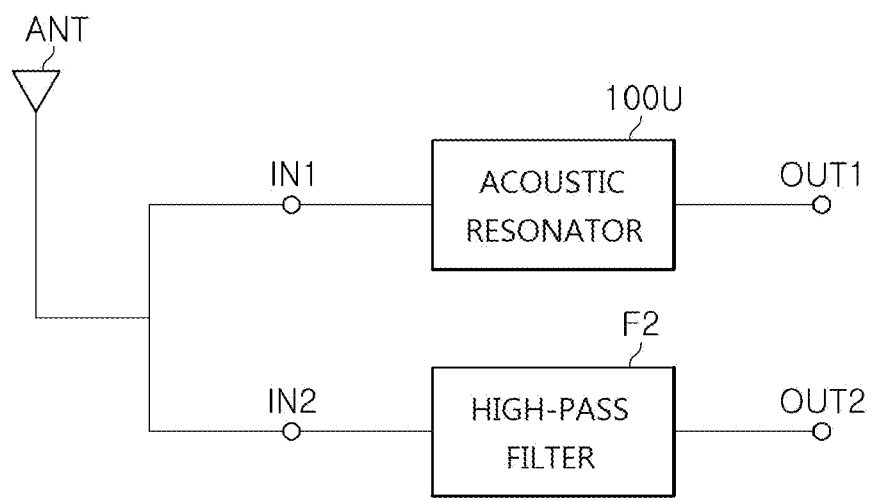
FIG. 8 is a block diagram illustrating an example of a combination of an acoustic resonator and a filter of an acoustic resonator filter package.

FIG. 8 is a block diagram illustrating an example of a combination of an acoustic resonator and a filter of an acoustic resonator filter package.

Referring to FIG. 8, an acoustic resonator 100U includes an input terminal IN1 and an output terminal OUT1, and a high-pass filter F2 includes an input terminal IN2 and an output terminal OUT2. The input terminal IN1 may be a first electrode of the acoustic resonator 100O, and the output terminal OUT1 may be a second electrode of the acoustic resonator 100U.

The input terminal IN1 of the acoustic resonator 100U and the input terminal IN2 of the high-pass filter F2 are electrically connected to an antenna ANT.

An RF signal of a first frequency band (e.g., 3 to 4 GHz) passes through the acoustic resonator 100U but is blocked by the high-pass filter F2, and an RF signal of a second frequency band (e.g., 5 to 6 GHz) passes through the high-pass filter F2 but is blocked by the acoustic resonator 100U.

Figure 9A:
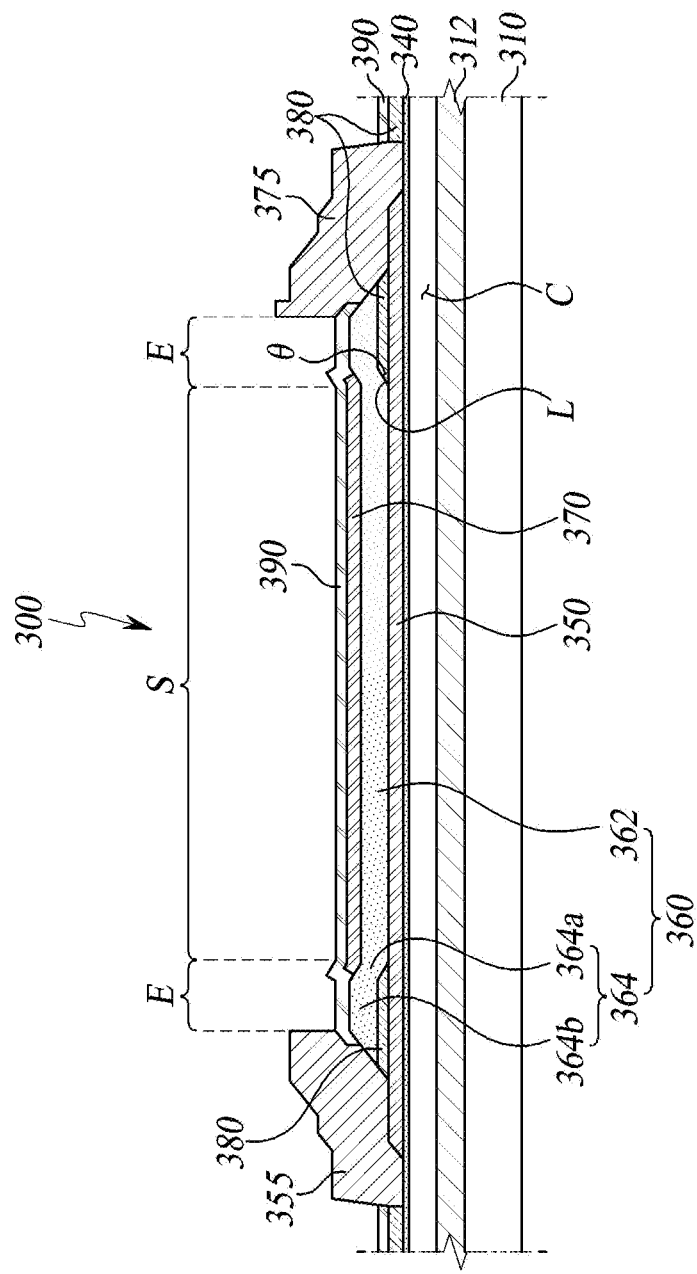
FIGS. 9A to 9C are cross-sectional diagrams illustrating examples of additional elements of an acoustic resonator of an acoustic resonator filter.
Figure 9B:
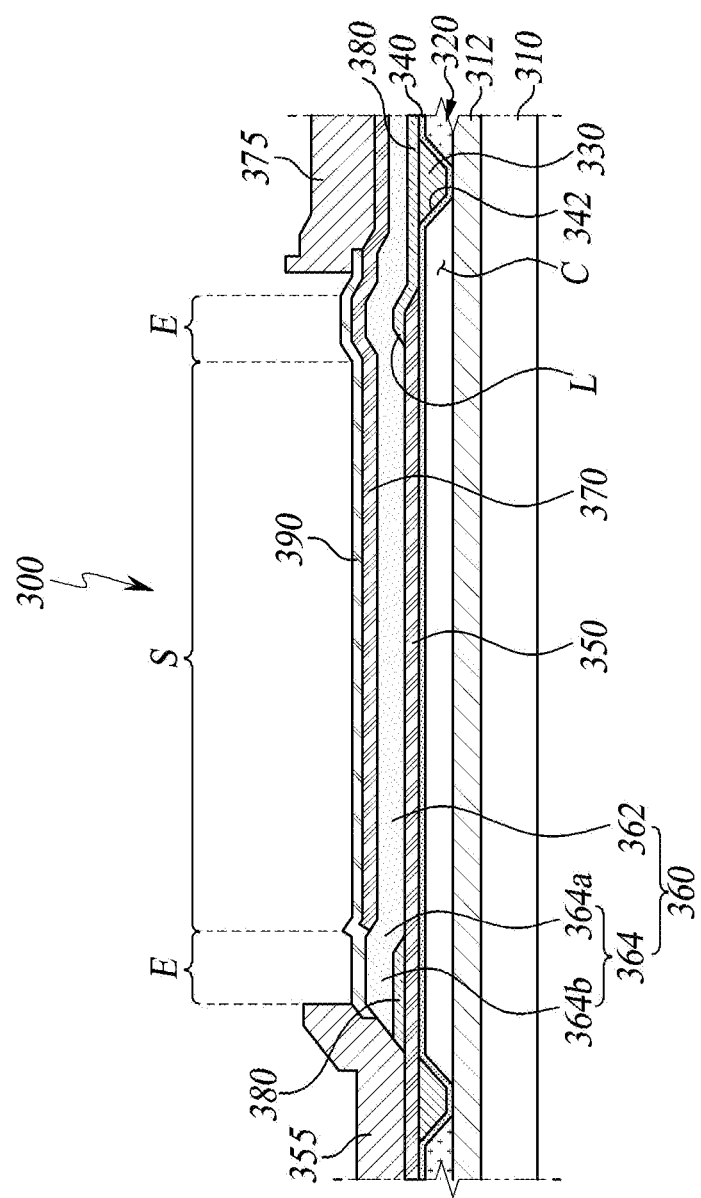
Figure 9C:
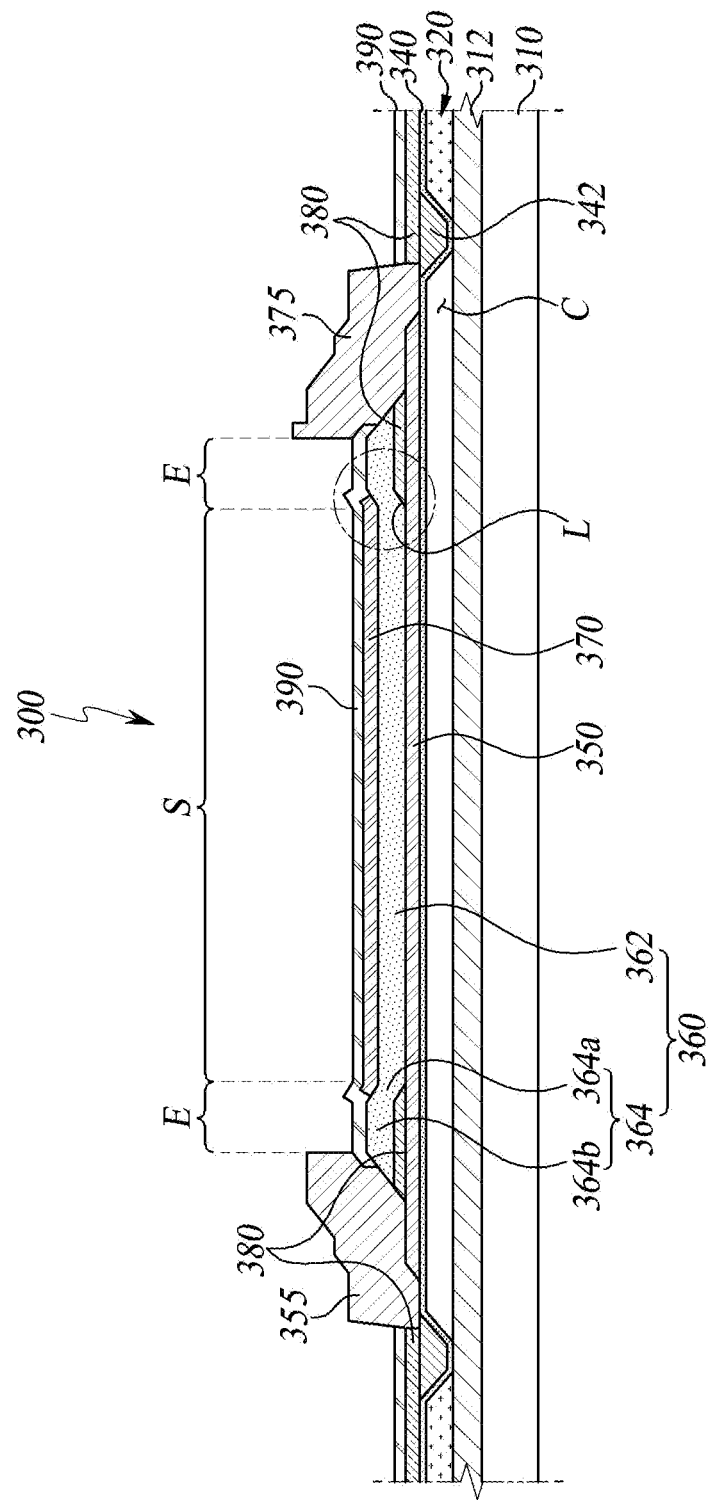

FIGS. 9A to 9C are cross-sectional diagrams illustrating examples of additional elements of an acoustic resonator of an acoustic resonator filter package.

Referring to FIGS. 9A to 9C, a resonance portion 300 includes a sacrificial layer 320, an etch stop portion 330, a membrane layer 340, a lower electrode 350, a first metal pad 355, a piezoelectric material layer 360, an upper electrode 370, a second metal pad 375, an insertion layer 380, and a passivation layer 390.

A substrate 310 may be a silicon wafer or a silicon-on-insulator (SOI) type substrate.

An insulating layer 312 is disposed on an upper surface of the substrate 310, and electrically isolates the substrate 310 from the resonance portion 300. The insulating layer 312 also prevents the substrate 310 from being etched by an etching gas when a cavity C is formed during a process of manufacturing the acoustic resonator.

For example, the insulating layer 312 may be made of any one or any combination of any two or more of silicon oxide ($SiO_2$), silicon nitride ($Si_3N_4$), aluminum oxide ($Al_2O_3$), and aluminum nitride (AlN), and may be formed on the substrate 110 by any one or any combination of any two or more of a thermal oxidation process, a chemical vapor deposition process, an RF magnetron sputtering process, and an evaporation process.

The sacrificial layer 320 is formed on the insulating layer 312 of the substrate 310, and the etch stop portion 330 is disposed in the sacrificial layer 320. The cavity C is formed by partially removing the sacrificial layer 320 with an etching gas during a manufacturing process. Since the cavity C is formed by partially removing the sacrificial layer 320, the lower electrode 350 disposed above the sacrificial layer 320 may be flat. For example, as the sacrificial layer 320, an easily etched material such as polysilicon or polymer may be used, but the material of the sacrificial layer 320 is not limited thereto.

The etch stop portion 330 is disposed along an edge of the cavity C. The etch stop portion 330 prevents a region of the sacrificial layer 320 beyond the cavity C from being etched during the formation of the cavity C. The etch stop portion 330 may be made of the same material as the insulating layer 312, but the material of the etch stop portion 330 is not limited thereto.

The membrane layer 340 and the substrate 310 enclose the cavity C. The membrane layer 340 may be made of a material having a low reactivity with an etching gas (e.g., a halogen such as fluorine (F) or chlorine (Cl), or $XeF_2$) used to remove the sacrificial layer 320. The etch stop portion 330 is disposed in a groove portion 342 formed by the membrane layer 340. The membrane layer 340 may be a dielectric layer including any one or any combination of any two or more of silicon nitride ($Si_3N_4$), silicon dioxide ($SiO_2$), magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not illustrated) made of aluminum nitride (AlN) may be formed on the membrane layer 340. Thus, the seed layer may be disposed between the membrane layer 340 and the lower electrode 350. The seed layer may be made of a dielectric material or a metal having an HCP crystal structure other than aluminum nitride (AlN). As an example, when the seed layer is a metal, the seed layer may be made of titanium (Ti).

The lower electrode 350 is formed on the membrane layer 340, and a portion of the lower electrode 350 is disposed above the cavity C.

The first metal pad 355 is formed on portions of the membrane layer 340, the lower electrode 350, the insertion layer 380, the piezoelectric layer 360, and the passivation layer 390 as shown in FIG. 9A, or on portions of the lower electrode 350, the insertion layer 380, the piezoelectric layer 360, and the passivation layer 390 as shown in FIG. 9B, or on portions of the etch stop portion 342, the membrane layer 340, the lower electrode 350, the insertion layer 380, the piezoelectric layer 360, and the passivation layer 390 as shown in FIG. 9C.

The piezoelectric material layer 360 covers at least a portion of the lower electrode 350 disposed above the cavity C.

The piezoelectric material layer 360 includes a piezoelectric portion 362 disposed in a planar portion S and a curved portion 364 disposed in an expanded portion E.

The piezoelectric portion 362 is a portion directly stacked on an upper surface of the lower electrode 350. Thus, the piezoelectric portion 362 is interposed between the lower electrode 350 and the upper electrode 370, and has flat surfaces in contact with flat surfaces of the lower electrode 350 and the upper electrode 370.

The curved portion 364 is defined as a region extending to an end of the piezoelectric material layer 360 from the piezoelectric portion 362 and positioned in the expanded portion E.

The curved portion 364 is disposed on the insertion layer 380, and conforms to a shape of the insertion layer 380. Accordingly, the piezoelectric material layer 360 is curved at a boundary between the piezoelectric portion 362 and the curved portion 364, and the curved portion 364 conforms to a thickness and a shape of the insertion layer 380.

The curved portion 364 is divided into an inclined portion 364a and an extended portion 364b.

The inclined portion 364a is a portion of the curved portion 364 inclined along an inclined surface L of the insertion layer 380. The extended portion 364b is a portion of the curved portion 364 extending to an end of the piezoelectric material layer 360 from the inclined portion 364a.

A surface of the inclined portion 364a is parallel to the inclined surface L of the insertion layer 380, and an inclination angle of the inclined portion 364a is equal to an inclination angle ($\theta$ in FIG. 9A) of the inclined surface L of the insertion layer 380.

The upper electrode 370 covers at least the piezoelectric portion 362 of the piezoelectric material layer 360 disposed above the cavity C.

The second metal pad 375 is formed on portions of the membrane layer 340, the lower electrode 350, the insertion layer 380, the piezoelectric layer 360, and the passivation layer 390 as shown in FIG. 9A, or on portions of the upper electrode 370 and the passivation layer 390 as shown in FIG. 9B, or on portions of the etch stop portion 342, the membrane layer 340, the lower electrode 350, the insertion layer 380, the piezoelectric layer 360, and the passivation layer 390 as shown in FIG. 9C.

The first metal pad 355 and the second metal pad 375 may be made of a material such as gold (Au), a gold-tin (Au—Sn) alloy, copper (Cu), a copper-tin (Cu—Sn) alloy, aluminum (Al), or an aluminum alloy. For example, the aluminum alloy may be an aluminum-germanium (Al—Ge) alloy.

The insertion layer 380 is disposed between the lower electrode 350 and the piezoelectric material layer 360. The insertion layer 380 may be made of a dielectric material including any one or any combination of any two or more of silicon oxide ($SiO_2$), aluminum nitride (AlN), aluminum oxide ($Al_2O_3$), silicon nitride ($Si_3N_4$), magnesium oxide (MgO), zirconium oxide ($ZrO_2$), lead zirconate titanate (PZT), gallium arsenide (GaAs), hafnium oxide ($HfO_2$), titanium oxide ($TiO_2$), and zinc oxide (ZnO), and is made of a material different from a material of which the piezoelectric material layer 360 is made. Also, if desired, a region in which the insertion layer 380 is provided may be formed into an gap by removing the insertion layer 380 during a manufacturing process.

A thickness of the insertion layer 380 may be equal to or approximately equal to a thickness of the lower electrode 350. Alternatively, a thickness of the insertion layer 380 may be less than a thickness of the piezoelectric material layer 360. For example, the insertion layer 380 may have a thickness of 100 Å or more, which may be less than a thickness of the piezoelectric material layer 360. However, the thickness of the insertion layer 380 is not limited thereto.

The insertion layer 380 is disposed along a surface formed by the membrane layer 340, the lower electrode 350, and the etch stop portion 330.

The insertion layer 380 is disposed around a boundary of the planar portion S and supports the curved portion 364 of the piezoelectric material layer 360. Thus, the curved portion 364 of the piezoelectric material layer 360 is divided into the inclined portion 364a and the extended portion 364b in accordance with a shape of the insertion layer 380.

The insertion layer 380 is disposed in a region of the resonance portion 300 other than the planar portion S. For example, the insertion layer 380 may be disposed in an entire region of the resonance portion 300 other than the planar portion S, or may be disposed in a partial region of the resonance portion 300 other than the planar portion S.

Also, at least a portion of the insertion layer 380 is disposed between the piezoelectric material layer 360 and the lower electrode 350.

A side surface of the insertion layer 380 disposed adjacent to the planar portion S is configured so that the further the side surface is spaced apart from the planar portion S, the greater the thickness of the side surface. Furthermore, the side surface of the insertion layer 380 disposed adjacent to the planar portion S is an inclined surface L having a certain inclination angle ($\theta$).

When the inclination angle ($\theta$) of the side surface of the insertion layer 380 is less than 5°, a thickness of the insertion layer 380 may need to be excessively reduced or an area of the inclined surface L may need to be excessively increased to achieve the inclination angle, which may be difficult to implement.

When an inclination angle of the side surface of the insertion layer 380 is greater than 70°, an inclination angle of the inclined portion 364a of the piezoelectric material layer 360 stacked on the insertion layer 380 will also be greater than 70°. In this case, the piezoelectric material layer 360 may be excessively curved, resulting in cracks appearing in the curved portion 364 of the piezoelectric material layer 360.

Thus, the inclination angle ($\theta$) of the inclined surface L should be equal to or greater than 5° and less than or equal to 70°, but is not limited thereto.

The passivation layer 390 is formed in an entire region of the resonance portion 300 other than portions where the first metal pad 355 and the second metal pad 375 are formed. The passivation layer 390 prevents the upper electrode 370 and the lower electrode 350 from being damaged during a process.

Furthermore, a portion of the passivation layer 390 may be removed by an etching process to adjust a frequency in a final process. Thus, a thickness of the passivation layer 390 may be adjusted. The passivation layer 390 may be a dielectric layer including any one or any combination of any two or more of silicon nitride ($Si_3N_4$), silicon oxide ($SiO_2$), magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

In the examples described above, in the acoustic resonator filter package, the acoustic resonator and the filter may be compressively disposed, such that the acoustic resonator filter package 200 may have a reduced size and may stably provide an accommodation space to accommodate the acoustic resonator and the filter.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator filter package comprising:
   an acoustic resonator comprising a piezoelectric layer, a first electrode disposed on a first surface of the piezoelectric layer, and a second electrode disposed on a second surface of the piezoelectric layer;
   a first substrate having an upper surface on which the acoustic resonator is disposed, the first substrate comprising a first coupling member surrounding the acoustic resonator;
   a filter spaced apart from the acoustic resonator in an upward direction;
   a second substrate having a lower surface on which the filter is disposed, the second substrate comprising a second coupling member disposed above the first coupling member; and
   a connection member connecting the first coupling member and the second coupling member to each other, the connection member being made of a material different from a material of which the first coupling member and the second coupling member are made; and
   a conductive pillar electrically connecting the filter to the first substrate, wherein the second substrate comprises a cavity opening in a downward direction and having the filter disposed therein, and wherein the acoustic resonator filter package further comprises a cavity terminal disposed in the cavity and electrically connecting the filter to the conductive pillar.

2. The acoustic resonator filter package of claim 1, wherein the filter comprises a high-pass filter having a cut-off frequency higher than a resonance frequency of the acoustic resonator.

3. The acoustic resonator filter package of claim 1, wherein the conductive pillar comprises:
a first conductive coupling pillar electrically connected to the first substrate;
a second conductive coupling pillar electrically connected to the filter; and
a conductive connection pillar electrically connecting the first conductive coupling pillar and the second conductive coupling pillar to each other, the conductive connection pillar being made of a material different from a material of which the first conductive coupling pillar and the second conductive coupling pillar are made.

4. The acoustic resonator filter package of claim 3, wherein the first conductive coupling pillar, the second conductive coupling pillar, the first coupling member, and the second coupling member are made of a first material, and
the conductive connection pillar and the connection member are made of a second material different from the first material.

5. The acoustic resonator filter package of claim 3, wherein one end of the first conductive coupling pillar and one end of the first coupling member are disposed on a first virtual surface parallel to the upper surface of the first substrate, and
one end of the second conductive coupling pillar and one end of the second coupling member are disposed on a second virtual surface parallel to the upper surface of the first substrate and spaced apart from the first virtual surface.

6. The acoustic resonator filter package of claim 1, wherein the cavity further comprises an encapsulant encapsulating the filter, and
the encapsulant is spaced apart from the acoustic resonator.

7. The acoustic resonator filter package of claim 1, wherein the cavity terminal is made of a material different from a material of which the conductive pillar is made.

8. The acoustic resonator filter package of claim 1, wherein a melting point of each of the first coupling member and the second coupling member is lower than a melting point of the connection member.

9. The acoustic resonator filter package of claim 8, wherein the first substrate comprises:
a first exposed terminal electrically connected to the first electrode of the acoustic resonator; and
a second exposed terminal electrically connected to the second electrode of the acoustic resonator,
wherein the first exposed terminal, the second exposed terminal, and the connection member are made of the same material.

10. An acoustic resonator filter package comprising:
an acoustic resonator comprising a piezoelectric layer, a first electrode disposed on a first surface of the piezoelectric layer, and a second electrode disposed on a second surface, of the piezoelectric layer;
a first substrate having an upper surface on which the acoustic resonator is disposed;
a filter spaced apart from the acoustic resonator in an upward direction;
a second substrate having a lower surface on which the filter is disposed; and
a connection member surrounding an accommodation space between the first substrate and the second substrate, and connecting the first substrate and the second substrate to each other,
wherein the second substrate comprises a cavity in which the filter is disposed, and
an area of a cross-section of the cavity taken along a first plane parallel to the upper surface of the first substrate is smaller than an area of a cross-section of the accommodation space surrounded by the connection,
wherein the acoustic resonator filter package further comprises:
a conductive pillar disposed on the upper surface of the first substrate; and
a cavity terminal disposed in the cavity and electrically connecting the filter to the conductive pillar.

11. The acoustic resonator filter package of claim 10, wherein the conductive pillar comprises:
a first conductive coupling pillar disposed on the upper surface of the first substrate;
a second conductive coupling pillar electrically connected to the cavity terminal and disposed above the first conductive coupling pillar; and
a conductive connection pillar disposed between the first conductive coupling pillar and the second conductive coupling pillar, the conductive connection pillar being made of a material different from a material of which the first conductive coupling pillar and the second conductive coupling pillar are made.

12. The acoustic resonator filter package of claim 10, wherein the filter comprises a high-pass filter having a cut-off frequency higher than a resonance frequency of the acoustic resonator.

13. An acoustic resonator filter package comprising:
a first substrate having a first surface;
a second substrate having a first surface, the first surface of the second substrate facing the first surface of the first substrate;
an acoustic resonator disposed on the first surface of the first substrate, the acoustic resonator comprising a piezoelectric layer;
a filter disposed on the first surface of the second substrate;
a coupling structure coupling the first substrate and the second substrate to each other so that the filter is spaced apart from the acoustic resonator; and
a conductive pillar electrically connecting the filter to the first substrate,
wherein the coupling structure comprises:
a first coupling member connected to the first substrate;
a second coupling member connected to the second substrate; and
a connection member connecting the first coupling member and the second coupling member to each other, and
the first coupling member and the second coupling member are made of a material having a lower melting point than a material of which the first substrate is made, a material of which the second substrate is made, and a material of which the connection member is made, wherein the second substrate comprises a cavity opening toward the first surface of the first substrate and having the filter disposed therein, and the acoustic resonator filter package further comprises a cavity terminal disposed in the cavity and electrically connecting the filter to the conductive pillar.

14. The acoustic resonator filter package of claim 13, wherein the conductive pillar comprises:

a first conductive coupling pillar electrically connected to the first substrate;

a second conductive coupling pillar electrically connected to the filter; and a conductive connection pillar electrically connecting the first conductive coupling pillar to the second conductive coupling pillar, the first conductive coupling pillar and the second conductive coupling pillar are made of the same material as the first coupling member and the second coupling member, and the conductive connection pillar is made of the same material as the connection member.

* * * * *